US008670969B1

(12) United States Patent
Kundert

(10) Patent No.: US 8,670,969 B1
(45) Date of Patent: Mar. 11, 2014

(54) CIRCUIT SIMULATION SYSTEM WITH REPETITIVE ALGORITHMIC CHOICES THAT PROVIDES EXTREMELY HIGH RESOLUTION ON CLOCKED AND SAMPLED CIRCUITS

(76) Inventor: Kenneth Scott Kundert, Mountain View, CA (US)

( * ) Notice: Subject to any disclaimer, the term of this patent is extended or adjusted under 35 U.S.C. 154(b) by 193 days.

(21) Appl. No.: 13/157,281

(22) Filed: Jun. 9, 2011

Related U.S. Application Data

(63) Continuation of application No. 11/627,972, filed on Jan. 28, 2007, now abandoned.

(51) Int. Cl.
*G06F 17/50* (2006.01)
(52) U.S. Cl.
CPC .................................. *G06F 17/5022* (2013.01)
USPC ............................................... 703/14; 703/13
(58) Field of Classification Search
USPC ............................... 703/13–14; 716/112–113
See application file for complete search history.

(56) References Cited

U.S. PATENT DOCUMENTS 5,038,269 A * 8/1991 Grimble et al. ................. 700/52
5,610,847 A 3/1997 Kundert

OTHER PUBLICATIONS

Cadence, "Virtuoso © SpectreRF Simulation Option User Guide"., Production Version 5.1.41., Jul. 2005., 1600 Pages.*
Kenneth S. Kundert. The Designer's Guide to Spice and Spectre, Kluwer Academic Publishers, 1995, pp. 251-334 (provided with parent U.S. Appl. No. 11/627,972).
Kenneth S. Kundert, Introduction to RF simulation and its application. IEEE Journal of Solid-State Circuits, vol. 34, No. 9, Sep. 1999 (provided with parent U.S. Appl. No. 11/627,972).
J. M. Ortega and W. C. Rheinboldt. Iterative Solution of Nonlinear Equations in Several Variables (Classics in Applied Mathematics, 30). Society of Industrial & Applied Mathematics, 2000, pp. 181-189 (provided with parent U.S. Appl. No. 11/627,972).
Yousef Saad. Iterative Methods for Sparse Linear Systems. PWS Publishing Company, 1995, pp. 144-201 (provided with parent U.S. Appl. No. 11/627,972).
Ricardo Telichevesky, Kenneth S. Kundert, Jacob K. White. Efficient AC and noise analysis of two-tone RF circuits. Proceedings of the 33rd Design Automation Conference, Jun. 1996 (provided with parent U.S. Appl. No. 11/627,972).
Germund Dahlquist, Ake Bjorck and Ned Anderson. Numerical Methods. Prentice Hall, 1974, pp. 81-95, 255-305, 330-355, and 404-421.

* cited by examiner

*Primary Examiner* — Eunhee Kim

(57) ABSTRACT

A method for eliminating the Fourier analysis noise floor generated by a circuit simulator is disclosed. This is accomplished by making the simulator behavior during each Fourier analysis sample interval (704) algorithmically identical to that employed during every other sample interval. Thus between each Fourier analysis sample point (703), the step size, number of iterations, integration method, etc., are allowed to vary as needed with the proviso that each sample interval uses exactly the same sequence of time steps, and that each member of that sequence is algorithmically identical to the corresponding members in the sequences used on every other Fourier sample interval. In other words, the first time step in the first interval must be algorithmically identical to the first time step in every other interval. The same is true for the second step, the third step, and so on until the last step.

20 Claims, 8 Drawing Sheets

CIRCUIT SIMULATION SYSTEM WITH REPETITIVE ALGORITHMIC CHOICES THAT PROVIDES EXTREMELY HIGH RESOLUTION ON CLOCKED AND SAMPLED CIRCUITS

1 CROSS REFERENCE TO RELATED APPLICATIONS

This is a continuation of application Ser. No. 11/627,972, filed 28 Jan. 2007, now abandoned. The patent application identified above is incorporated here by reference in its entirety to provide continuity of disclosure.

2 FEDERALLY SPONSORED RESEARCH

Not applicable.

3 SEQUENCE LISTING OR PROGRAM

Not applicable.

4 BACKGROUND OF INVENTION

4.1 Field of Invention

This invention relates to the Fourier analysis of waveforms produced by circuit simulators. In particular the invention dramatically improves the resolution of the Fourier analysis, allowing small signals to be resolved that would otherwise be hidden in the error created by the simulator.

4.2 Background

A waveform (101 in FIG. 1) is a signal displayed versus time; it is the time-domain representation of a signal. Fourier analysis applied to a waveform transforms the signal to its frequency-domain representation: its spectrum (201 in FIG. 2). The frequency-domain representation is often very useful as it separates the signal components by their frequencies. As a result, very small signal components (203) can be resolved in the presence of much larger components (202) as long as they fall at different frequencies. These small signal components are often undesired artifacts that result from imperfections in the system that generates the signal. The engineers designing the system are often keenly interested in these small components of the signal as a measure of their system's performance. If they are too large the engineers will redesign their system to improve its performance until it meets the required specifications. This process is shown in FIG. 3.

When Fourier analysis is performed on signals produced by circuit simulators such as SPICE†, errors produced within the simulator tend to create a noise floor (204) that acts to reduce the dynamic range of the result (205) and hide these small signals (dynamic range is a measure of the resolution of the Fourier analysis result). If a critical signal component is smaller than the noise floor then it cannot be observed and the performance of the system cannot be measured. Designers become very frustrated when the noise floor of the simulator is high enough to make it impossible to verify that a system meets its performance requirements.

†. SPICE is a generic name that represents circuit simulators, programs that take a transistor-level description of a circuit and predict their behavior and performance through simulation. The name derives from a program written by Larry Nagel in the early 1970's. It was the starting point for countless derivative versions such as HPSpice, TiSpice, etc. At this point the term is used interchangeably with the term circuit simulator, and so refers to all Spice-like simulators, even those that do not derive from Spice.

Circuit simulators come with a set of knobs that a designer can use to control the accuracy of the result. The knobs adjust the tolerances and other settings used by the simulator to control accuracy. If the tolerances and such are tightened, the simulator adjusts its behavior so as to reduce the errors, which should lower the noise floor. Unfortunately, it is not uncommon for the noise floor to increase when these settings are tightened. This occurs because the simulator produces two types of error, only one of which causes the noise floor. Tightening the accuracy settings reduces the total error, but may actually increase the error that causes the noise floor.

This idea, that there are two types of error produced by the simulator, is novel and neatly explains the seemingly anomalous behavior of the simulator. It also directly leads to the idea that this error could be eliminated completely. It is well understood that the error produced by a circuit simulators stems from an innate loss of information when transforming a continuous-time representation of the circuit to a discrete-time representation. As a result, one naturally and correctly assumes that a certain level of error is unavoidable. However, the realization that there are two types of error and only one of those acts to reduce the resolution of Fourier analysis leads to the conjecture that it may be possible to eliminate this particular type of error without violating the assumption that there must be some error. And indeed, it is possible to eliminate this type of error. This invention disclosure shows how the error that creates the noise floor can be eliminated, thereby effectively eliminating the noise floor†.

†. The term 'noise floor' is use here because it is a well-known term that is commonly used to describe a closely related phenomenon, that being the limitation of the resolution of the Fourier analysis due to presence of small stochastic noise sources in the circuit. However, in this case it is assumed that these noise sources in the circuit are not present during the simulation and the observed 'noise floor' is actually due to simulator error. Technically simulator error is not noise, even though it appears similar to noise when observed with Fourier analysis. Perhaps the term 'error floor' would be more appropriate, however that term is not in common use. In this patent the term 'error floor' can be used interchangeably with the 'noise floor' with the understanding that if the circuit being simulated did include noise sources the observed noise floor would consist of two components, one from the circuit noise sources and one from the simulator error. This invention eliminates the component of the noise floor due to simulator error without affecting the component due to circuit noise sources.

Consider the circuit shown in FIG. 4, which consists of a sinusoidal current source (402) in parallel with a noiseless resistor (404) and a capacitor (403). Simulating the circuit with transient analysis would produce a waveform like that shown in FIG. 5 at its output (405). Generally the Fourier analysis is applied to one period of the signal (102), shown in FIGS. 5 and 6. For best results the last period is used to give the circuit time to settle. As shown in FIG. 5 the transient analysis interval (504) consists of an initial phase where the signal settles to its steady-state behavior (501), an optional phase where the simulator prepares to perform the Fourier analysis (502), and then the phase where the actual Fourier analysis occurs (503). FIG. 7 shows some of the details of the transient and Fourier analysis. The transient analysis breaks the transient analysis interval into a sequence of possibly non-uniform time steps (701) that are the intervals between time points (702). The circuit equations are solved at these points. During the Fourier analysis interval (503) the signal is sampled uniformly by the Fourier analyzer; meaning that the Fourier sample points (703) are separated in time by the Fourier sample intervals (704), all of which have the same size.

Notice that in FIG. 7 the simulation points (702) and the Fourier sample points (703) coincide. This is not a requirement. Many simulators place their time points without regard to the needs of a subsequent Fourier analysis. In this case the value of the signal at the Fourier sample points would be determined from the values computed by the simulator using interpolation.

4.3 Related Art

Fourier analysis is subject to seven types of error when performed in a circuit simulation context [kundert95]. The errors are:

1. The signal is not periodic in the Fourier analysis interval (503). Or, in other words, the nonperiodicity (601) is not negligible.
2. Fourier analysis begins before the circuit reaches steady state (or the initial transient interval (501) is too short).
3. Aliasing (the duration of the Fourier sample interval (704) is too long to accurately capture the dynamics of the waveform).
4. Interpolation error (simulation points (702) do not coincide with Fourier sample points (703)).
5. Simulation error (approximations made in the simulator corrupt the results somewhat).
6. Modeling error (approximations made in the models corrupt the results somewhat).
7. Limited numerical precision of the computer's representation of numbers.

Most of these errors can be addressed with known techniques.

If the circuit is driven and the response is periodic, then one just needs to choose the Fourier analysis interval so that it equals or is an exact multiple of the signal period (102) to avoid Error 1. If the circuit is autonomous and the response is periodic, then the signal period cannot be known exactly in advance. In this case it is up to the simulator to dynamically determine the period and choose the Fourier analysis interval appropriately. If the response of the circuit is not periodic, then windowing functions should be applied to make the signal appear periodic to the Fourier analyzer, which improves the resolution [harris78].

Error 2 can be avoided by carefully choosing the length of the initial transient interval (501). The simulator can help by determining the non-periodicity (601), which is the difference between the signal at the ends of the Fourier analysis interval, and either reporting it to the user so that he or she can manually increase the length of the initial transient interval if needed, or the simulator could extend the interval automatically.

Aliasing (Error 3) is an error that results from using a Fourier analysis sample interval (704) that is too long to accurately capture the dynamics of the signal. It is eliminated either by increasing the number of Fourier analysis sample points (703) in the Fourier analysis sample interval (503) until the aliasing disappears, or by using the Fourier Integral approach [kundert94] to compute the spectrum. The Fourier Integral approach is the subject of a US patent [kundert97].

Interpolation error (Error 4) is avoided by having the simulator place a time point (702) exactly at each of the Fourier analysis sample points (703), thereby eliminating the interpolation. This can be accomplished using strobing [kundert95].

Error 5, simulator error, is the subject of this patent. Prior to this patent, the only option was to tighten the tolerances of the simulator (these are the knobs described above [7]). However, this can only reduce the problem, not eliminate it. And, as mentioned before, it sometimes exacerbates the problem.

Modeling error (Error 6) is an error in the underlying circuit equations and is often not under the control of the user. It is most often a problem when the models are discontinuous as the discontinuity act to create a noise floor that would hide small signals of interest (203). One only needs to fix the models to avoid this error.

Finally, Error 7, the limited precision of the numbers on the computer, is generally negligible if double precision (64 bit) floating point numbers are used.

All of these errors can be eliminated or reduced to negligible levels using known techniques that involve either proper implementation of the simulator or careful choice of the simulator settings except Error 5, the simulator error. This error cannot be eliminated. However, with this invention, the error can be shaped in such a way that it does not limit the resolution of the Fourier analysis.

4.4 Objects and Advantages

The object of this patent is to prevent simulator errors (Error 5) from limiting the resolution of the Fourier analysis. In this way, designers (307) will be able resolve much smaller signals in the presence of large signals. Such signals generally are either a noise or a distortion and so are undesirable. They tend to be very small on high performance circuits. Being able to resolve them alerts the designer to their presence, which gives the designer the opportunity to improve the design (301) and reduce or eliminate the undesirable signal. Thus, with this invention designers will be able to design higher performance systems with confidence.

Designers often recognize when the resolution of their Fourier analysis is being limited by simulator error. If they need more resolution than they are getting, they will often begin a long and tedious process of trying to adjust the simulator to provide better accuracy. How to do this is often not well understood by designers and sometimes is simply not possible. With this invention, simulator errors and artifacts do not limit the resolution of the Fourier analysis, and so designers do not have to invest large amounts of time adjusting the simulator to get the resolution they need.

Though not widely understood, the way for designers to get the best resolution with existing simulators while performing Fourier analysis, is to coax the simulator to take identical time steps. This runs counter to normal simulator behavior and so is always difficult for the user to accomplish. However, with clocked circuits such as switched-capacitor filters, it is often not possible, or if possible not practical, because the simulator will always place time points on the corners of the clock waveforms, and those simply may not fall on a uniform grid of reasonable step size. In addition, forcing equally spaced points on clocked circuits can significantly slow the simulation. This invention allows clocked circuits to be handled easily without the need for uniform time steps. This makes it considerably more efficient than forcing equally spaced points, and it eliminates any need to modify the clock waveforms to make the simulation easier.

5 SUMMARY

This invention consists of a method for eliminating the Fourier analysis noise floor generated by a circuit simulator by making the simulator appear algorithmically identical to the Fourier analyzer over each Fourier analysis sample interval (704).

6 DRAWINGS

6.1 Figures

FIG. 1 shows a waveform. This is the natural output of a circuit simulator performing a transient analysis. The waveform shown is periodic with period T, meaning that it repeats with a given period T (102).

FIG. 2 shows a spectrum. This is the natural output of a Fourier analysis. It typically results from passing a waveform (101) through a discrete Fourier transform, generally in the form of a Fast Fourier Transform (FFT). The spectrum often consists of some large components (202) that correspond to the primary signal, some small components (203) that correspond to distortion products, and a noise floor (204). The noise floor is a result of either circuit noise or simulator error. In a transient analysis the circuit noise is generally not present, meaning the noise floor stems from the simulator error.

FIG. 3 shows a typical design flow that starts with a circuit designer (307) creating a circuit (301) that is simulated with a circuit simulator such as SPICE (302) to produce a set of waveforms (303) that represent the predicted behavior of the circuit. In order to view particular characteristics of the signals produced by the circuit, a Fourier analyzer (304) might be used to convert the waveforms into spectra (305). Viewing the spectra with a display (306) often provides insight or information that is used by the designer to improve the design of the circuit.

FIG. 4 shows an example test circuit: a simple RC circuit driven by a sinusoidal current source. The circuit is linear and noiseless and so produces a periodic steady-state response that contains no distortion products (203) and no noise floor (204). If these things are present in the computed results then they are an artifact of the simulator rather than the circuit. This fact will be used later to demonstrate the resolution achieved with and without the invention.

FIG. 5 shows the signal at the output of example test circuit (FIG. 4). An interval (501) is allowed to pass before starting the Fourier analysis to allow any initial transients to fully decay. An optional interval is shown that is used to prepare for the Fourier analysis (502). The Fourier analysis occurs during the Fourier analysis interval (503). This interval is T seconds long, where T is the period of the signal (102) or some integer multiple thereof.

Figure 8:
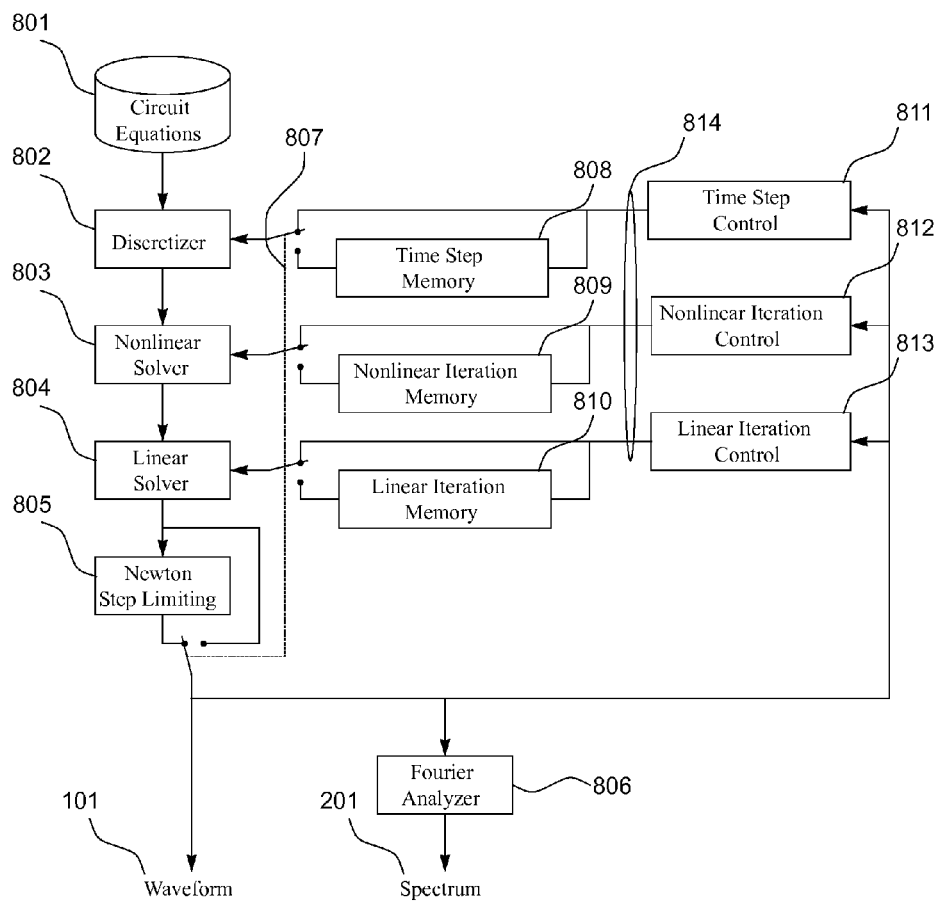

FIG. 8 shows a block diagram for simulator and Fourier analyzer. The main signal flow for the simulator is shown on the left (801-805). The input is the circuit equations (801), which includes mathematical models of all components in the circuit, equations that represent the circuit structure using Kirchhoff's laws, and the stimulus waveforms. The circuit equations are continuous-time differential equations that are converted to discrete-time difference equations by the discretizer (802). The discretizer builds a set of equations that can be numerically solved at a finite set of time points (702) to approximate the solution of the circuit equations. The actual time points used are determined by the time step control (811). Typically the discretizer uses numerical integration techniques such as backward Euler, trapezoidal rule, or the backward difference formulae, to perform the discretization. The equations output by the discretizer are nonlinear. They are converted by the nonlinear solver (803) into a sequence of linear equations whose solutions converge to the solution of the nonlinear system of equations. Typically the nonlinear solver implements the Newton-Raphson algorithm or some variant. The number and type of iterations used by the nonlinear solver is determined by the nonlinear iteration control (812). The nonlinear solver produces a large coupled set of linear equations that is solved by the linear solver. The linear solver uses Gaussian elimination or some type of iterative solver such as a Krylov-based method (GMRES, etc.). The number, type, and order of iterations is determined by the linear iteration control (813). Both the nonlinear solver and the linear solver are optional; some circuit simulators, notably those that use explicit integration methods, do not need them. Finally the output of the linear solver is passed through Newton step limiting (805) as a way of improving the convergence properties of the nonlinear solver (803). The simulation result is a waveform that approximately solves the circuit equations over the simulation interval (504). This waveform is processed by the Fourier analyzer (806) to produce a spectrum (201). During the initial transient (501) and the Fourier analysis training interval (502) the algorithmic choices (814) in the simulator are controlled directly by the control blocks (811-813) and the Newton step limiting is engaged, as determined by the switches (807). During the training interval the time steps and iterations are also recorded by the associated memories, the time step memory (808), the nonlinear iteration memory (809), and the linear iteration memory (810). During the Fourier analysis interval (503), and outside the training interval if they overlap, the switches change position and the time steps and iterations used by the simulator are replayed from the memories. Also, a switch bypasses the Newton step limiting (805), here being used to represent all simulator algorithms that act in a nonlinear fashion on the signal (including the various bypass algorithms).

Figure 1:
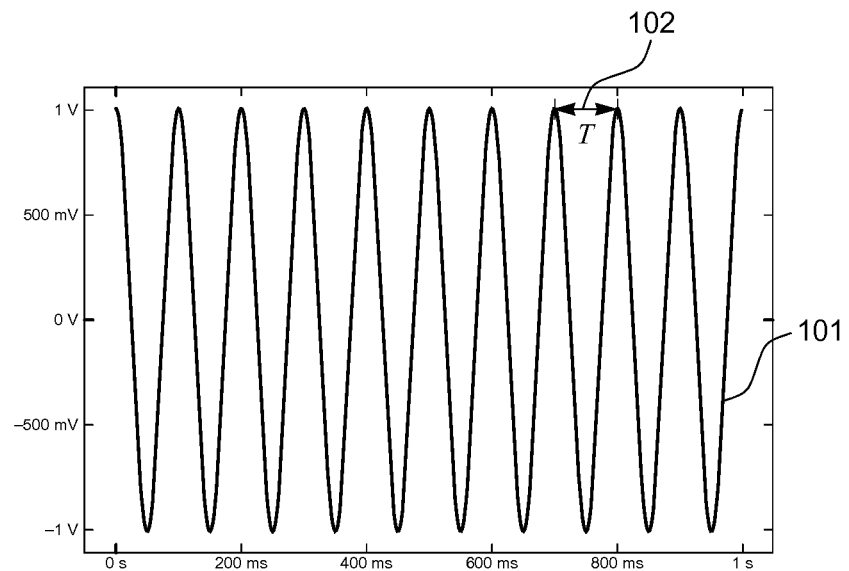
Figure 2:
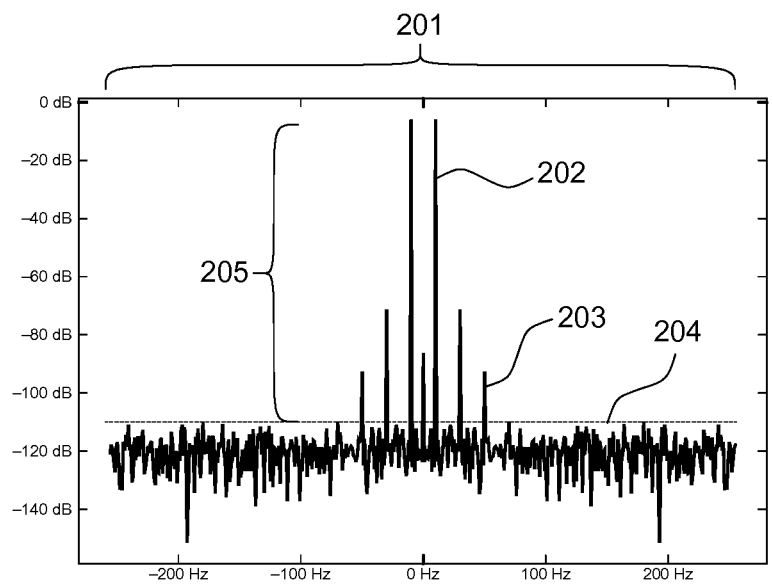
Figure 3:
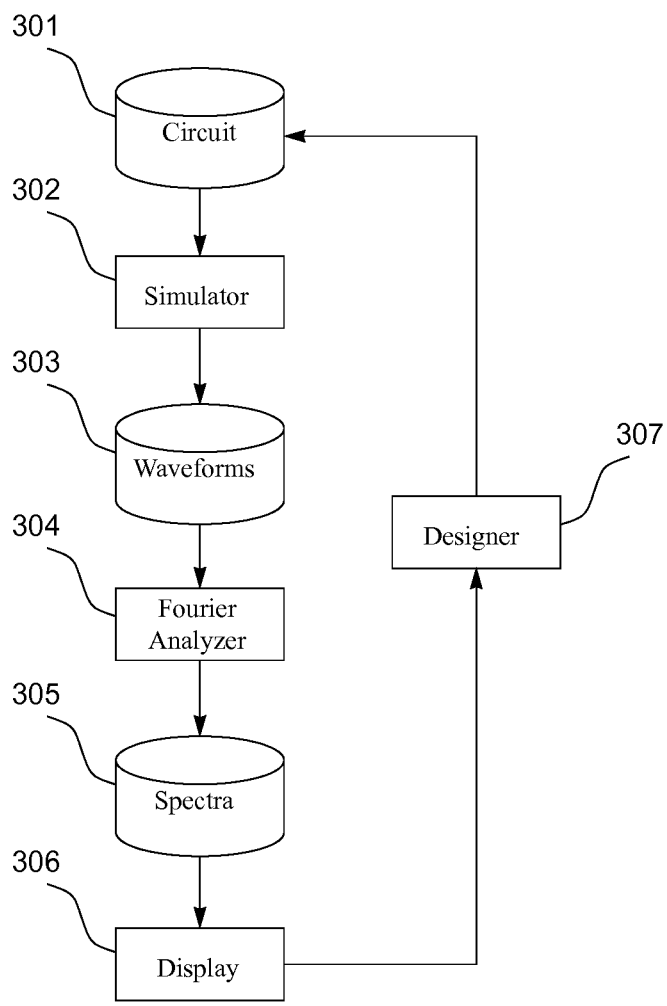
Figure 4:
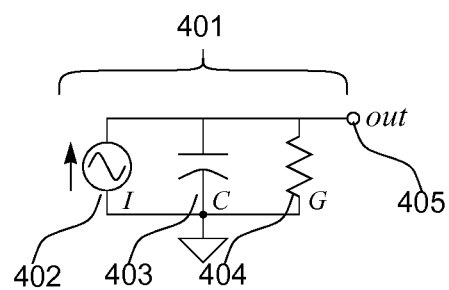
Figure 5:
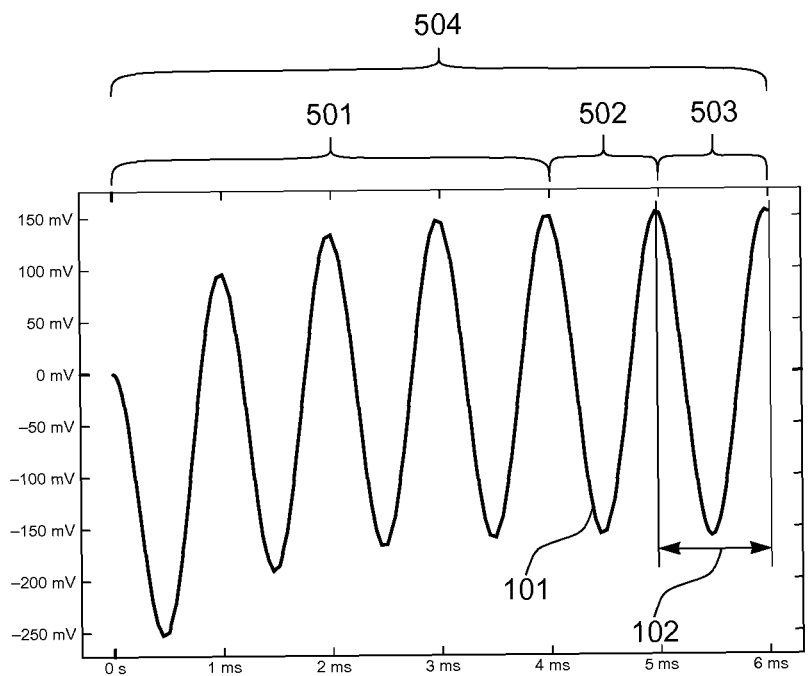
Figure 6:
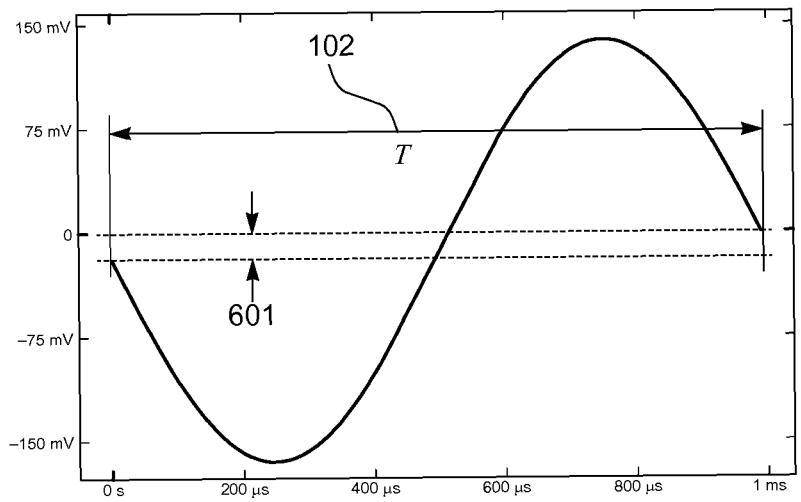
FIG. 6 illustrates the measurement of non-periodicity. It is a measure of how far the response of the circuit is from periodic steady state (601).
Figure 7:
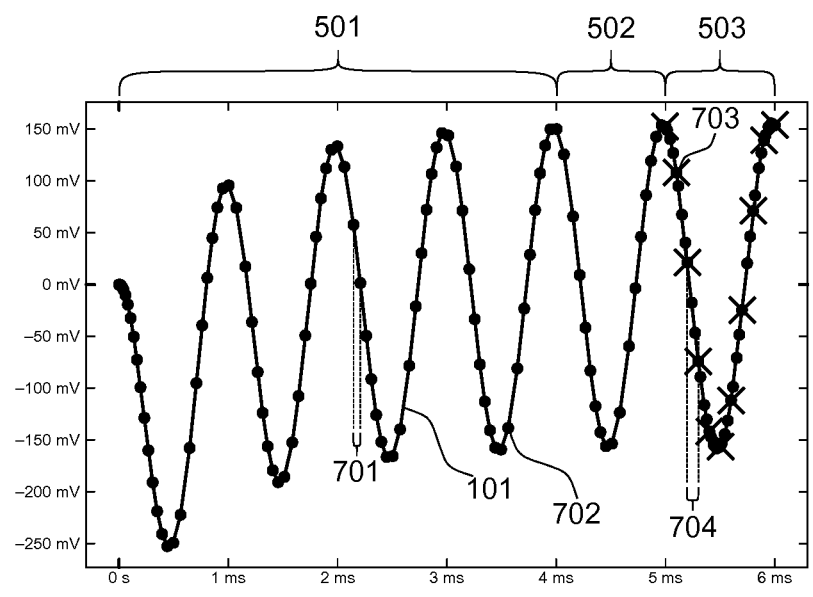
FIG. 7 shows the time steps (701), time points (702), Fourier analysis sample points (703), and Fourier analysis sample intervals (704) for the waveform of FIG. 5. The time points are used by the simulator and the sample points are used by the Fourier analyzer.
Figure 9:
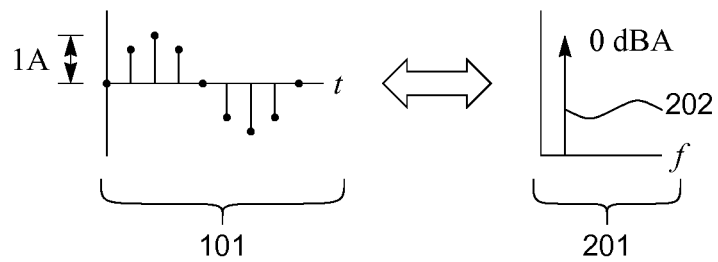

FIG. 9 shows the discrete-time approximation to the source current waveform of the circuit in FIG. 4 and its spectrum. The waveform, or time-domain representation of the signal, is shown on the left and the spectrum, or frequency-domain representation, is shown on the right.

Figure 10:
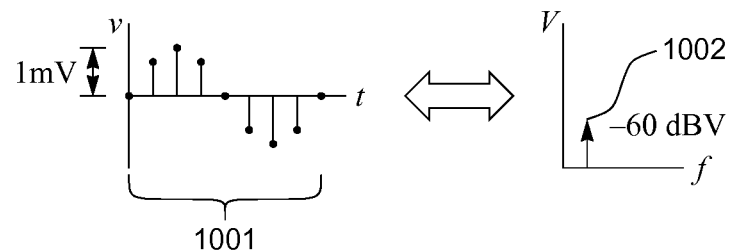

FIG. 10 shows the error in the solution computed by the circuit simulator for the circuit of FIG. 4. The error waveform (1001) is on the left and the error spectrum (1002) is on the right.

Figure 11:
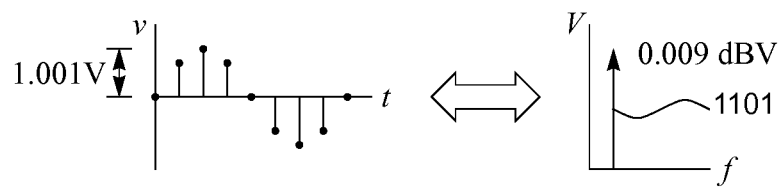

FIG. 11 shows the computed response, which is the sum of the true solution and the error of FIG. 10. Notice that the spectrum of the computed response (1101) is a pure tone, there is no noise floor.

Figure 12:
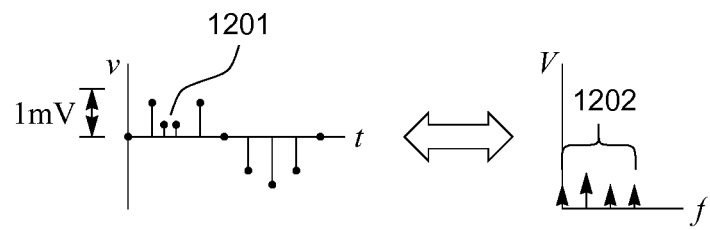

FIG. 12 shows the error that results when the second time step is split into two.

Figure 13:
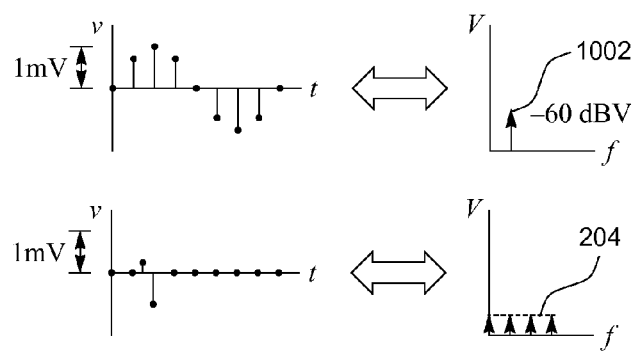

FIG. 13 shows the error of FIG. 12 partitioned into a pure tone (top) and residual (bottom).

Figure 14:
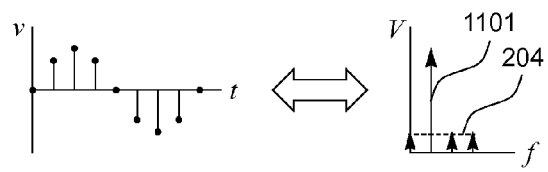

FIG. 14 shows the computed response (the sum of the true solution and the error of FIG. 12) after being sampled for the FFT. Notice the noise floor (204) that was created as a result of the simulator taking non-uniform time steps.

Figure 15:
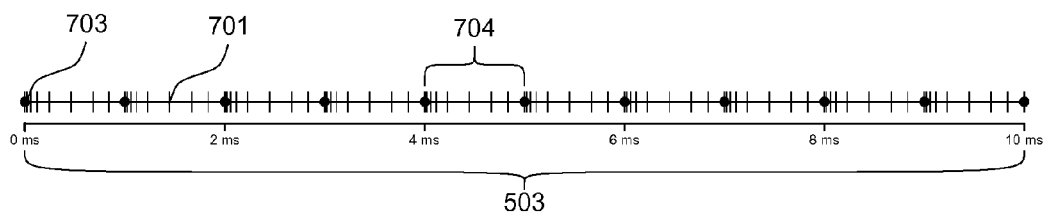

FIG. 15 shows a representative set of time points as chosen by the invention when applied to a clocked circuit.

Figure 16:
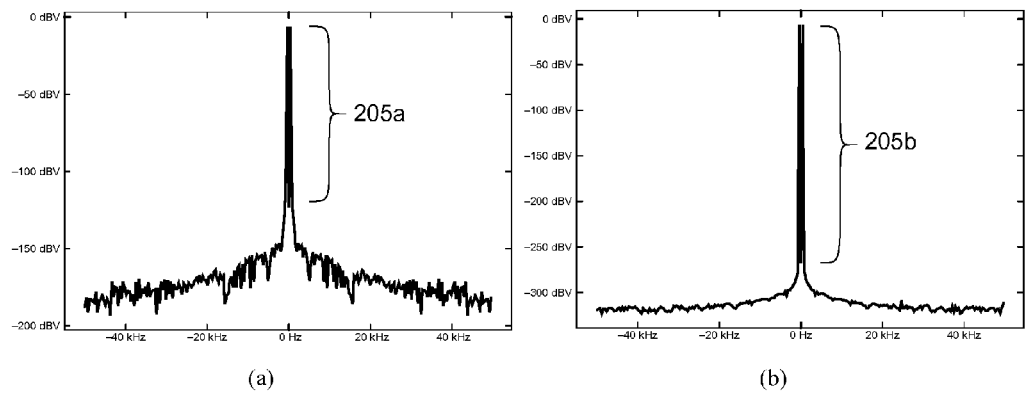

FIG. 16 shows the effect of the invention when applied during the simulation of the circuit of FIG. 4. The time steps used when producing the spectrum of FIG. 16a were taken from an unconstrained circuit simulator simulating a switched-capacitor filter. The time steps that produced the spectrum of FIG. 16b were the same for the first Fourier sample interval, at which point they repeated as required by this invention in a manner similar to that shown in FIG. 15. The use of the invention improves the dynamic range from 111 dB (205a) to 256 dB (205b).

Figure 17:
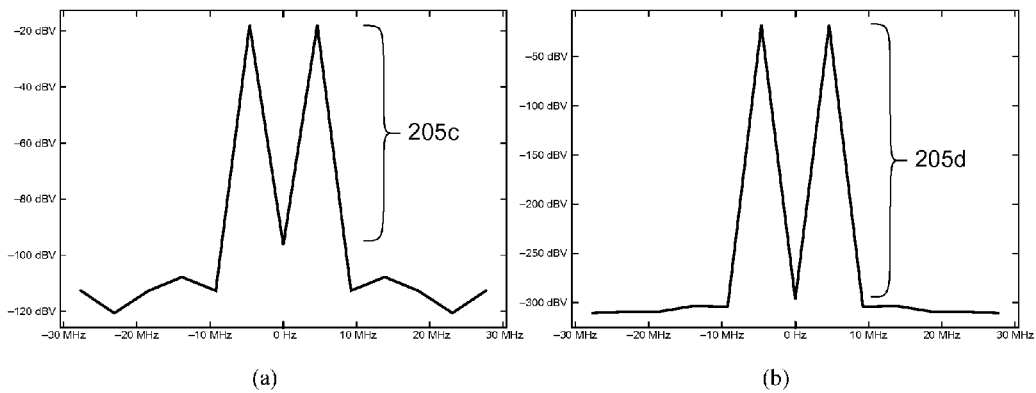

FIG. 17 shows the effect of the invention when applied during the simulation of the circuit of FIG. 4. The time steps used when producing the spectrum of FIG. 17a were taken from an unconstrained circuit simulator simulating a mixer. The time steps that produced the spectrum of FIG. 17b were the same for the first Fourier sample interval, at which point they repeated as required by this invention in a manner similar to that shown in FIG. 15. The use of the invention improves the dynamic range from 66 dB (205*c*) to 268 dB (205*d*).

6.2 Reference Numerals

101—waveform
102—signal period
201—spectrum
202—large signal component
203—small signal component
204—noise floor
205—dynamic range (the ratio of the primary signal component (202) to the noise floor (204))
301—a circuit, typically in the form of a schematic or netlist
302—a circuit simulator
303—a database of waveforms
304—a Fourier analyzer. It performs Fourier analysis on one or more waveforms to produce one or more spectra.
305—a database of spectra
306—a display used for viewing the spectra
307—a designer that uses the spectra to improve the design of the circuit
401—test circuit
402—stimulus (sinusoidal current source)
403—capacitor
404—noiseless resistor
405—output of test circuit
501—initial transient interval
502—Fourier analysis training interval (can also be placed at the beginning of (and overlap) the Fourier analysis interval (503)).
503—Fourier analysis interval. Must equal or be an exact multitude of the signal period (102) for best results.
504—Simulation interval. Must equal or be longer than the sum of initial transient interval (501), the training interval (502), and the Fourier analysis interval (503).
601—non-periodicity
701—time step
702—time point
703—sample point
704—sample interval
801—equations of circuit to be simulated
802—discretizer (converts differential equation to a sequence of difference equations)
803—nonlinear solver (converts nonlinear difference equations to sequence of linear equations)
804—linear equation solver
805—Newton step limiting (here being used to represent all simulator algorithms that act in a non-linear fashion on the signal)
806—Fourier analyzer
807—switches
808—time step memory
809—nonlinear iteration memory
810—linear iteration memory
811—time step control
812—nonlinear iteration control
813—linear iteration control
814—algorithmic choices
1001—error waveform
1002—error spectrum, notice that the error is concentrated at signal frequency
1101—large signal component (202) contaminated with error (1002) unaccompanied by noise floor (204)
1201—error that results when two time small steps (701) that replace one large step
1202—error spread over many frequencies so as to form a noise floor

7 DETAILED DESCRIPTION

Circuit simulators work by approximating a continuous-time system that cannot be solved numerically with a closely-related discrete-time system that can. This involves a three step process where the circuit equations are discretized, linearized, and solved as shown in FIG. 8 (these three steps can occur in any order). There is inherently some error in this process. The essential idea of this invention is not to eliminate the error in the approximation, which would be impossible, but instead to make the transformation linear and to eliminate the time-varying nature of the approximation, at least as seen by the Fourier analysis. This eliminates the frequency translation that causes the noise floor. If the transformation is linear and time invariant (LTI), then all the error will fall at the same frequency as the signal and there will be no noise floor.

Consider simulating the circuit shown in FIG. 4. Assume the current source (402) produces a pure 1 KHz sine wave and a Fourier analysis is performed on the signal at out (405). Assume that after the output settles into periodic steady state a Discrete Fourier Transform (DFT) that uses 8 time points is applied, meaning that it will place sample points (703) every 125 μs (the Fourier analysis interval (503) is 1 ms and the Fourier sample interval (704) is 125 μs). And further assume that the simulator has been configured to take identical 125 μs time steps (701) using the Gear second order backward difference formula. Since the circuit is linear, the steady-state response at out only contains energy at the source frequency, in this case 1 KHz. Gear's method is also linear, and so any error generated must be proportional to the input signal. Thus in this case, the DFT result will have no noise floor. In other words, the spectrum as computed by the DFT will only have a nonzero term at 1 KHz, and the error in that term is proportional to the size of the signal, so as the signal shrinks, the error also shrinks at the same rate. In this case the error will never limit the resolution of the measurement. If there is some small signal at a frequency other that 1 KHz, it will be resolvable as there are no error signals at that same frequency to hide it. If the small signal is at 1 KHz, then it may well be hidden, but by the desired signal and not by the error.

This can be explained graphically as follows. Once the simulator transforms the circuit to a discrete-time approximation, the source current waveform looks like the signal shown in FIG. 9 in both the time and frequency domains.

The integration method (in this example the Gear second-order backward difference method) is linear, meaning that the error it produces is proportional to the true solution. As such, it could be represented by the signal in FIG. 10 (the actual numbers are chosen to be representative). Here we are assuming that the true solution would have a 1 V amplitude and the error generated by the integration method is a representative 0.1% (or 1 mV).

Thus, the computed solution would look like the signal in FIG. 11, which consists of the sum of the 1 V true solution and the error of FIG. 10.

Notice that there is no noise floor contributed by the error. Thus, if there was a slight imperfection in the circuit that generated a small distortion product at one or more harmonics of the 1 KHz fundamental, it would be easily seen and resolved.

Now consider the effect of taking non-uniform time steps by splitting the second time step into two. This would have the effect of cutting the error on each of these two steps by four (assuming a second-order method). Now the error looks like the signal shown in FIG. 12.

This signal can be seen to be equal to the combination of a sinusoid and the residual as shown in FIG. 13. The top of this figure shows the sinusoid and the bottom shows the residual. Together, they sum to the signal shown in FIG. 12.

Finally as shown in FIG. 14, the response would look sinusoidal in the time domain, but the frequency-domain result shows the noise floor (204) that needs to be avoided. The noise floor occurs because the non-uniform time step makes the discretization process appear time varying to the Fourier analysis. This breaks the LTI assumption and acts to convert energy from the stimulus frequency to all other frequencies, which is what creates the noise floor. In this case the total error is less, but there is a noise floor that acts to hide artifacts such as distortion products that result from small imperfections in the circuit.

The above example demonstrates how non-uniform time steps (701) during a Fourier sample interval (704) create the noise floor. Similar examples can be created that demonstrate how changing the integration method used by the discretizer (802) or the number of iterations used by the nonlinear solver (803) or linear solver (804), etc., will also create a noise floor.

As mentioned previously, to prevent this noise floor from being created, two things must be done. First, the transformation from continuous-time circuit to discrete-time approximation must be linear. Thus, all nonlinear simulation algorithms such as step limiting algorithms (805), device bypass, subcircuit bypass, and the like† should be disabled. A simulation algorithm is nonlinear if it acts in a nonlinear fashion, or in other words, if doubling the size of the signals in the system that the algorithm is applied to does anything other than simply double the size of the computed response. Thus, all algorithmic dependence on the signal size must be eliminated. This includes its effect on the size of the time step (701) and on the number of iterations used by the nonlinear (803) and linear (804) solvers. Second, the transformation must be time-invariant from the perspective of the sampling analyses. Thus, the sequence of algorithmic choices made by the simulator during each sampling interval must be identical. The algorithmic choices made by the simulator could include, but are not limited to, the following 1. time step size
2. time step type (which integration method is used)
3. the iterations used by the nonlinear solver (the number of iterations and type of each iteration (ex. full Newton versus Samanskii [ortega00]))
4. the iterations used by the linear solver (with direct methods such as Gaussian elimination the equations would be processed in the same order, with iterative methods such as Krylov subspace methods [saad95], the subspaces would be processed (and recycled [telichevesky96]) in the same order up to the same number)
5. circuit partitions (any partitioning of the circuit would be held constant throughout the Fourier analysis interval)
6. component model representations (the representation level of each component model would not change during the Fourier analysis interval)

†. Newton step limiting shrinks or limits the size of the step taken during an iteration when using Newton or Newton-like methods as a way of improving the convergence properties of the method [ortega00]. Device bypass is a technique used by SPICE to improve the efficiency of simulation whereby the evaluation of a device model is bypassed and the previous values for its terminal currents are used if its terminal voltages have not changed significantly from a previous time point. Subcircuit bypass is similar to device bypass, but is applied to entire subcircuits. It should be understood that bypass algorithms are simply replacing a complicated model for a simpler model under particular circumstances. As described, the simpler models are zero-order or constant current models. However more complicated models, such as first-order or linear models, could also be used.

In the simplest form of the invention one would constrain the simulator to take evenly spaced time points with exactly the same integration method and number and type of iterations used on each step, while disabling Newton step limiting (805) and other nonlinear operations. The idea is to make every time step algorithmically identical to every other during the Fourier analysis interval. The time step (701) could either exactly match the Fourier analysis sample interval (704), or could be some exact sub-multiple (it is important that each sample point (703) fall exactly on a simulation point (702) to eliminate interpolation error). Thus for each time step during the Fourier analysis interval (503) the length of the step and the integration method used during that step must be the same. In addition, on each step the same number and type of Newton iterations should be taken. For example, if 8 iterations were used on a particular time step with the $1^{st}$ and $5^{th}$ being full Newton iterations (where the Jacobian matrix is updated) and the rest being Samanskii iterations (where the Jacobian is reused from a previous iteration), then this sequence should be repeated on every step. Finally, if using an iterative linear solver such as one that uses Krylov-based methods, then the number of and order of iterations (the way in which the Krylov subspace is constructed) should be repeated identically on each time step.

This simple form is difficult or impossible to apply in many situations. One common example is clocked circuits. Clocked circuits generally use piecewise linear (PWL) pulse waveforms as their clock signals. The PWL signals require that simulation points be placed at their corners, which may not be equally spaced. They also require the integration method to switch to a first order method at their corners, which would be undesirable to use on all steps. So instead, the following more flexible approach was developed.

During a Fourier analysis sample interval (704) the step size (701), number of iterations, integration method, etc. are allowed to vary as needed with the proviso that each sample interval uses exactly the same sequence of time steps, and that each member of that sequence is algorithmically identical to the corresponding members of the sequences used on every other Fourier sample interval. In other words, the first time step in the first interval must be the same as the first time step in every other interval. The same for the second step, the third step, etc. A set of time points that demonstrates this is shown in FIG. 15. In this way, while variation in the algorithms used on each time step acts to modulate the error, that variation occurs in exact synchronism with the sampling required by the Fourier analysis. The modulation occurs at the sample rate of the Fourier analysis and so is ignored by the Fourier analysis. Another way of saying this is that to the Fourier analysis, the sequence of algorithmic choices made on each Fourier analysis step is both linear and identical and so from the perspective of the Fourier analysis the simulator appears to be LTI.

It may happen with clocked circuits that the frequency of the clock signal is incommensurate with the desired sample rate of the Fourier analysis. However, this issue is resolvable as long as the circuit has a periodic response and the clock frequency is a multiple of the frequency of the response. In this situation the Fourier analysis sample rate can always be adjusted until it is equal, to or a sub-multiple of, the clock frequency.

In order to assure that the normal simulator error control is maintained during the Fourier analysis, it is expected that a training interval (502) would be employed where the conditions that would exist during the Fourier analysis would be imposed and the time-steps and iterations used would be recorded for the length of one Fourier sample interval (704). During this training interval, the tolerances might be tightened a bit to make the recorded time steps and iterations somewhat conservative. Then as the Fourier analysis begins the traditional controls on the time step and iteration count are disabled along with the Newton step limiting algorithms and instead the size of each step, the integration method, and the number and type of iterations on each step are replayed from the record. The recorded sequence is repeated exactly during each Fourier sample interval until the Fourier analysis is complete, then the normal control of time step and iteration is restored. During the Fourier analysis period (503) the simulator's normal error control mechanisms could continue to monitor the error produced by the simulator, and if accuracy limits are exceeded or convergence problems encountered the whole process restarted with more conservative assumptions.

7.1 Alternative Embodiments

There are many possible variations in the way that simulator error control can be maintained during the Fourier analysis interval. For example, rather than using one Fourier sample interval as the training interval (502), one could use more than one, or perhaps even one or more full Fourier analysis intervals (503). Or, one could use the first sample interval (704) as the training interval (the training interval and the analysis interval would overlap). When using full Fourier analysis intervals as the training interval, one could monitor the periodicity constraint (the allowed upper bound on the nonperiodicity (601)) and continue the training period until the constraint is met as a way of insuring that the initial transient has decayed to the point where it is no longer significant before the Fourier analysis interval begins.

To avoid convergence problems during the Fourier analysis one could simply add extra iterations to each time point, or perhaps convert the iterations to full Newton iterations. One could also choose the time step in the training period to avoid the need for any type of Newton step limiting. There are a variety of ways of reacting to convergence problems or violations of the simulators error criteria that occur during the Fourier analysis interval (503). For example, the simulator could either produce a warning message for the user or restart the Fourier analysis interval.

Employing all aspects of this invention often provides much more dynamic range in the Fourier analysis results than is required in most situations. It is possible to trade some of this resolution to ease the burden of implementing the invention by simply not implementing all of the aspects of the invention. Controlling the time step and integration method tend to have a large effect. Controlling the number of iterations used by the nonlinear solver (803) and linear solver (804) and disabling Newton step limiting have a lesser effect, particularly if the tolerances used by these algorithms is tightened for the duration of the Fourier analysis. Thus it may be possible to simplify the implementation of the invention by adding only the time step memory (808) and not adding the iteration memories (809-810) or the ability to disable Newton step limiting, bypass, etc.

This invention describes many things that can be controlled during the Fourier analysis to improve the resolution of the analysis, each of which acts to eliminate a source of error. Some are sources of large errors and some are sources of small errors. It is important to recognize that the invention does not require that all of these techniques for increasing the resolution be employed together. They can, in fact, be employed individually or in any combination. The basic underlying mandate of the invention is to eliminate or minimize algorithmic variation between Fourier sample intervals (704). Many of the mechanisms for algorithmic variation have been mentioned, but there may be others that exist today or will be created in the future as the art of simulation advances. This invention covers the idea of eliminating or minimizing mechanisms of variation, even those not mentioned.

The simplest form of this invention is to simply fix the time step, the integration method, the number of iterations, etc. in advance, perhaps based on results observed during a training interval or perhaps by other means, such as choosing values that seem reasonable based on prior experience or by simply asking the user. In this case the memories of FIG. 8 are not needed. However, even this simple form is included in this invention.

The invention was described as being applied to a circuit simulator. But the invention is useful with any type of simulator that solves differential equations and whose results would be processed with Fourier analysis.

7.2 Application

The invention was applied to the simulation of the circuit in FIG. 4. This circuit is linear, time invariant, and noiseless and so in steady state produces a spectrum without distortion products or noise floor. If they are present in the results they must be an artifact of the simulator. To test the invention, different sets of time steps were used. In the first case a set of time steps was extracted from the actual simulation of a switched-capacitor filter. In this case, a large number of time steps were used, resulting in the expectation that the results should be very accurate. This set was then applied as is to simulate the circuit and produce the results shown in FIG. 16*a*. The results shown in FIG. 16*b* were produced using the same time steps up to the end of the first Fourier sample interval (704), at which time the steps used during the first sample interval were simply repeated until the end of the Fourier analysis interval (503). The first set of time steps represents those found in an unconstrained simulator and the second represents time steps that would be produced under the constraints of this invention. Without the invention, the dynamic range of the Fourier analysis was 111 dB (205*a*). This is a reasonably good result, a result that was achieved at the cost of a long simulation by using a very large number of time steps. However, with the invention the resolution increased to 256 dB (205*b*), a factor of 20 million improvement.

The whole process was repeated using a set of time steps extracted from the simulation of a mixer. In this case, many fewer time steps were used. The results are shown in FIG. 17. Here the dynamic range increased from 66 dB (205*c*) to 268 dB (205*d*), an improvement of 12 billion.

In both these cases the limitation of dynamic range due to the simulator was effectively eliminated. All that remains to limit the dynamic range is the finite precision of the real numbers on a computer, which is negligible from the user's perspective.

These ideas will be useful in all circuit simulators, including traditional SPICE-like simulators (ex. Spectre, HSPICE, Eldo, etc.), RF simulators that include transient analysis (ADS, GoldenGate, etc.) or transient-envelope analyses [kundert99] that employ non-uniform steps (SpectreRF, etc.), and high capacity, reduced accuracy or timing simulators (ex. HSim, Nanosim, Ultrasim). These ideas can also be applied to dramatically reduce noise floor type errors in RF simulators based on shooting methods (SpectreRF). In fact, this idea can be applied to any transient or transient-like simulator whose output is processed by a discrete Fourier transform. In addition, the Fourier analysis can be performed either within the simulator or in a distinct data analysis or display tool that may access the waveforms after the simulation is complete.

The idea is not suitable in situations where it is not possible to use the same sequence of time steps on each Fourier analysis sample interval. For example, with pulse position or pulse width modulators sharp edges move about on each cycle, making it impossible to use this method. However Fourier analysis that employs equally spaced sample points (DFT rather than Fourier integral [kundert97]), which is the primary target for this method, are generally not suitable on these circuits.

The basic concept of this invention can also be applied to improve simulation in other situations; situations that might not involve Fourier analysis at all. For example, in shooting-based RF simulators [kundert99] these ideas can also improve the convergence of the shooting algorithm by reducing variation between the shooting iterations. The same would be true when using transient or transient-like analyses to compute the sensitivity of the circuit's response to changes in its initial state, its component parameter values, or its environment, which is very useful in a variety of process including circuit optimization and synthesis. In fact, these ideas would be useful on any type of transient simulation where repeatability over a sequence of intervals is required. Examples include any large signal noise or jitter simulations, where variation in the simulator algorithms could produce variation in the result that is mistaken for noise or jitter produced by the circuit. These are examples of perturbation analysis, where the behavior of the circuit is examined in the presence of small perturbations of either the circuit or its stimulus. In the case of noise and jitter the perturbation is in the stimulus. When the perturbation is in the circuit the perturbation analysis is often referred to as a Monte Carlo analysis. Many other non-Fourier analysis applications of this invention are likely to exist now and in the future.

7.3 Advantages

This invention addresses a long standing problem with circuit simulators, a problem that is particularly vexing for users, that of achieving adequate resolution when using Fourier analysis. The only alternative for the user is to painstakingly adjust the simulator settings in the hope that the accuracy of the simulation and subsequent Fourier analysis could be sufficiently improved. However, there is no direct method for doing this. There is no one setting that when adjusted will always improve Fourier analysis resolution. In fact, tightening the simulator tolerances can make the Fourier analysis resolution worse. This makes this issue very frustrating and time consuming. In addition, tightening tolerances can dramatically slow the simulation. Even if it is possible to configure the simulator settings to get sufficient resolution, it may result in an impractically long simulation.

This situation has been tolerated by users of circuit simulators for the last thirty years because there was no known alternative. This invention resolves this deficiency in simulators. Not only does it completely resolve the issue for most circuits, but it does so efficiently, without dramatically slowing the simulation.

8 REFERENCES

[harris78] Fredric J. Harris. On the Use of Windows for Harmonic Analysis with the Discrete Fourier Transform. *Proceedings of the IEEE*, vol. 66, no. 1, January 1978.
[kundert94] Kenneth S. Kundert. Accurate Fourier analysis for circuit simulators. Proceedings of the 1994 *IEEE Custom Integrated Circuits Conference*, May 1994.
[kundert95] Kenneth S. Kundert. *The Designer's Guide to SPICE and Spectre*. Kluwer Academic Publishers, 1995.
[kundert97] Kenneth S. Kundert. Ratiometric Fourier analyzer. U.S. Pat. No. 5,610,847. March 1997.
[kundert99] Kenneth S. Kundert. Introduction to RF simulation and its application. *IEEE Journal of Solid-State Circuits*, vol. 34, no. 9 in September 1999.
[ortega00] J. M. Ortega and W. C. Rheinboldt. *Iterative Solution of Nonlinear Equations in Several Variables* (Classics in Applied Mathematics, 30). Society for Industrial & Applied Mathematics, 2000.
[saad95] Yousef Saad. *Iterative Methods for Sparse Linear Systems*. PWS Publishing Company, 1995.
[telichevesky96] Ricardo Telichevesky, Kenneth S. Kundert, Jacob K. White. Efficient AC and noise analysis of two-tone RF circuits. *Proceedings of the 33rd Design Automation Conference*, June 1996.

The invention claimed is:

1. A simulation system; said simulation system receiving a circuit description and a set of accuracy settings and producing at least one waveform; said waveform comprising a solution value at each of a plurality of time points that span a training interval and a plurality of sample intervals; said simulation system comprising:
   a. at least one controller; said controller initially receiving said set of accuracy settings and, at each of at least those time points that fall within said training interval, receiving said solution value from any of prior said time points and producing a set of proposed algorithmic choices;
   b. at least one memory unit: said memory unit receiving a sequence from said controller comprised of said set of proposed algorithmic choices for each of said time points in said training interval and producing said sequence during said training interval and each of said sample intervals;
   c. at least one solver; said solver initially receiving said circuit description, said sequence during said training interval and each of said sample intervals, said solution value from any of prior said time points, and producing said solution value at each of said time points;
   whereby each said sequence of sets of algorithmic choices used by said solver during each of said sample intervals is identical so as to provide an improvement in repeatability of said simulation system between each of said sample intervals.

2. The simulation system of claim 1 wherein said controller produces said set of proposed algorithmic choices at each of said time points in said training interval as a response to said solution value at any of prior said time points.

3. The simulation system of claim 1 further comprising:
   d. an analyzer, said analyzer producing at least one spectrum from each said solution value from at least some of said time points;
   whereby said improvement in repeatability improves the accuracy of said spectrum.

4. The simulation system of claim 1 wherein said controller is at least one selected from the group comprising a time step controller, a nonlinear iteration controller, and a linear iteration controller, and wherein said solver is at least one selected from the group comprising a discretizer, a nonlinear solver, a linear solver, and a step limiter, and wherein said set of proposed algorithmic choices comprises at least one selected from the group comprising a time step size, an integration method, an iteration count, and an iteration type.

5. The simulation system of claim 4 further comprising:
   d. an analyzer, said analyzer is at least one selected from the group comprising a discrete Fourier transform, a fast Fourier transform, a Fourier integral-based analyzer, and a z transform;

said analyzer producing at least one spectrum from each said solution value of at least some of said time points whereby said improvement in repeatability improves the accuracy of said spectrum.

6. The simulation system of claim 1 wherein each of said sample intervals is coincident whereby said simulation system can operate within a larger system that implements an iterative process wherein each of said sample intervals is a result of one iteration of said iterative process and whereby said improvement in repeatability provides an advantage for said iterative process; said advantage being at least one selected from the group comprising improved accuracy, improved resolution, improved speed, improved robustness, and improved convergence.

7. A method for operating a computing system to simulate a circuit and produce at least one waveform; said computing system comprising at least one processor unit, at least one memory unit connected to said processor unit, at least one simulation program in communication with said processor unit said waveform comprising a solution value at each of a plurality of time points that span a transient analysis interval; said transient analysis interval comprising a training interval and a plurality of sample intervals; said method comprising:
 a. accepting a description of said circuit;
 b. accepting a set of accuracy settings;
 c. producing a set of algorithmic choices at each of said time points that fall within said training interval from said set of accuracy settings and from said solution value from any of prior said time points;
 d. recording into said memory unit a sequence comprised of said set of algorithmic choices at each of said time points that fall within said training interval;
 e. producing from said memory unit a recalled sequence during each of said sample intervals by replaying said sequence;
 f. producing said solution value at each of said time points in said training interval from said description, from said set of algorithmic choices, and from said solution value from any of prior said time points;
 g. producing said solution value at each of said time points in each of said sample intervals from said description, from said recalled sequence, and from said solution value from any of prior said time points;
 whereby said recalled sequence used during each of said sample intervals is identical so that said method provides a reduced variation between each of said sample intervals.

8. The method of claim 7 further comprising:
 h. producing at least one spectrum from said waveform;
 whereby said reduced variation improves the accuracy of said spectrum.

9. The method of claim 7 wherein said set of algorithmic choices comprises at least one selected from the group comprising a time step size, an integration method, an iteration count, and an iteration type.

10. A simulation system; said simulation system receiving a description of a circuit and a set of accuracy settings and producing at least one waveform; said waveform comprising a solution value at each of a plurality of time points that span a transient analysis interval; said transient analysis interval comprising a plurality of contiguous sample intervals, each of said contiguous sample intervals having equal duration; said simulation system comprising:
 a. at least one processor unit;
 b. at least one memory unit connected to said processor unit;
 c. at least one simulation program in communication with said processor unit;
 d. at least one controller implemented within said simulation program; said controller initially receiving said set of accuracy settings and, at each of at least those time points that fall outside of said contiguous sample intervals, receiving said solution value and producing a set of proposed algorithmic choices; said set of proposed algorithmic choices differing between said time points in response to changes in said solution value;
 e. a sequence of sets of predetermined algorithmic choices, the duration of said sequence being equal to the duration of each of said contiguous sample intervals;
 f. at least one switch implemented in said simulation program; said switch producing a set of employed algorithmic choices at each of said time points in said transient analysis interval by selecting said set of proposed algorithmic choices at each of said time points that fall outside said contiguous sample intervals and by selecting a set of predetermined algorithmic choices taken in order from said sequence of sets of predetermined algorithmic choices at each of said time points that falls within each of said contiguous sample intervals;
 g. at least one solver implemented in said simulation program; said solver producing said solution value at each of said time points in said transient analysis interval from said description, from said solution value of at least some of earlier said time points in said transient analysis interval, and from said set of employed algorithmic choices;
 whereby said solver uses the exact same said sequence of sets of predetermined algorithmic choices in each of said contiguous sample intervals so as to provide a reduced variation between each of said contiguous sample intervals.

11. The simulation system of claim 10 wherein said set of employed algorithmic choices is not affected by said solution value at each of said time points that fall within said contiguous sample intervals, and said set of employed algorithmic choices is affected by said solution value at each of at least some of said time points that fall outside any of said contiguous sample intervals.

12. The simulation system of claim 10 wherein said transient analysis interval further comprises a training interval, said training interval with duration equal to the duration of each of said contiguous sample intervals; said simulation system further comprising:
 h. at least one memory interface taking as input said set of proposed algorithmic choices and providing as output said sequence of sets of predetermined algorithmic choices; said memory interface recording as a chronological sequence into said memory unit said set of proposed algorithmic choices for each of said time points that fall within said training interval and playing back from said memory unit said chronological sequence during each of said contiguous sample intervals producing said set of predetermined algorithmic choices at each of said time points that fall within each of said contiguous sample intervals.

13. The simulation system of claim 12 wherein said controller is at least one selected from the group comprising a time step controller, a nonlinear iteration controller, and a linear iteration controller, and wherein said solver is at least one selected from the group comprising a discretizer, a nonlinear solver, a linear solver, and a step limiter, and wherein said set of employed algorithmic choices comprises at least one selected from the group comprising a time step size, an integration method, an iteration count, and an iteration type.

14. The simulation system of claim 13 further comprising:
   i. an analyzer, said analyzer producing at least one spectrum from each said solution value from at least some of said time points from said contiguous sample intervals; whereby said reduced variation improves the accuracy of said spectrum.

15. The simulation system of claim 14 wherein said analyzer is one selected from the group comprising a discrete Fourier transform, a fast Fourier transform, a Fourier integral-based analyzer, a z transform, and a jitter analyzer.

16. The simulation system of claim 13 wherein said analyzer observes said waveform at a plurality of sample points and said controller places an additional time point at each of said sample points whereby said analyzer computes said spectrum without interpolation of said waveform.

17. The simulation system of claim 14 wherein said transient analysis interval further comprises an initial transient interval that precedes said training interval and wherein said controller observes a non-periodicity at each signal period of said waveform during said initial transient interval, and extends said initial transient interval until said non-periodicity drops below a predetermined level, thereby delaying said training interval, whereby computation of said spectrum is delayed until said circuit has reached steady state.

18. The simulation system of claim 14 wherein said transient analysis interval further comprises an initial transient interval that precedes said training interval and wherein said controller observes a signal period of said waveform during said initial transient interval and scales the duration of said training interval and the duration of each of said contiguous sample intervals so that the duration of all said contiguous sample intervals equals an integer multiple of said signal period of said waveform, whereby said analyzer adapts to said signal period of said waveform.

19. The simulation system of claim 13 wherein said solution value of at least some of said time points that fall within said contiguous sample intervals are observed by said controller; said controller causing said simulation system to stop processing said contiguous sample intervals; to tighten said set of accuracy settings by a predetermined amount; to reprocess said training interval; to then restore original values of said set of accuracy settings, and then to restart simulation of said contiguous sample intervals if said controller determines that observed said solution value does not satisfy said set of accuracy settings.

20. The simulation system of claim 13 wherein said set of accuracy settings is used by said controller during said contiguous sample intervals and a second tighter set of accuracy settings is used by said controller during said training interval whereby the likelihood of exceeding simulator error bounds during said contiguous sample intervals is reduced.

* * * * *